United States Patent
Poulsen et al.

(10) Patent No.: US 9,681,241 B2
(45) Date of Patent: Jun. 13, 2017

(54) APPARATUS, SYSTEMS AND METHODS FOR DETECTING INSERTION OR REMOVAL OF AN AUDIO ACCESSORY FROM AN ELECTRONIC DEVICE

(71) Applicant: BLACKBERRY LIMITED, Waterloo (CA)

(72) Inventors: Jens Kristian Poulsen, Kitchener (CA); Yong Zhang, Waterloo (CA); Per Magnus Fredrik Hansson, Waterloo (CA)

(73) Assignee: BLACKBERRY LIMITED, Waterloo (CA)

( * ) Notice: Subject to any disclaimer, the term of this patent is extended or adjusted under 35 U.S.C. 154(b) by 328 days.

(21) Appl. No.: 13/777,942

(22) Filed: Feb. 26, 2013

(65) Prior Publication Data

US 2014/0241535 A1    Aug. 28, 2014

(51) Int. Cl.
*H04R 5/04* (2006.01)
*H04R 29/00* (2006.01)
*G01R 31/02* (2006.01)

(52) U.S. Cl.
CPC ............ *H04R 29/001* (2013.01); *H04R 5/04* (2013.01); *G01R 31/024* (2013.01); *G01R 31/025* (2013.01); *H04R 2420/05* (2013.01)

(58) Field of Classification Search
CPC .... H01R 13/71; H01R 13/641; H01R 13/703; H01R 2201/20; G01R 31/02; G01R 31/04; G01R 31/21; G01R 31/021; G01R 31/024; G01R 31/025; G01R 31/046; G01R 31/2832; H04R 29/00; H04R 5/04; H04M 1/60

USPC .................... 381/58; 439/668, 676
See application file for complete search history.

(56) References Cited

U.S. PATENT DOCUMENTS

| | | | |
|---|---|---|---|
| 5,917,916 A * | 6/1999 | Sibbald | H04S 1/002 381/1 |
| 6,397,087 B1 * | 5/2002 | Kim | H04B 1/3877 381/110 |
| 7,869,608 B2 * | 1/2011 | Sander et al. | 381/113 |
| 7,952,840 B2 * | 5/2011 | Ford | H01R 13/6683 361/13 |
| 8,150,046 B2 * | 4/2012 | Hansson et al. | 381/58 |
| 8,428,288 B2 * | 4/2013 | Lim | 381/384 |

(Continued)

FOREIGN PATENT DOCUMENTS

EP    2461553 A1    6/2012

OTHER PUBLICATIONS

"Low-Power Headset Detectors with SEND/END Button Support" Maxim Integrated Products, Sunnyvale CA 2012.*

(Continued)

*Primary Examiner* — Davetta W Goins
*Assistant Examiner* — Oyesola C Ojo
(74) *Attorney, Agent, or Firm* — Perry + Currier Inc.

(57) ABSTRACT

According to one aspect, an electronic device for detecting an audio accessory. The electronic device includes an audio jack having at least two detection terminals. The detection terminals are spaced apart and positioned within a socket of the audio jack so when an audio plug of the accessory is inserted into the socket of the audio jack, the detection terminals will be shorted. The presence of a short between the detection terminals is indicative that the audio accessory is present.

14 Claims, 9 Drawing Sheets

(56) References Cited

U.S. PATENT DOCUMENTS

| | | | |
|---|---|---|---|
| 8,831,234 B2* | 9/2014 | Turner et al. ................. 381/58 |
| 2003/0013499 A1* | 1/2003 | Aotake ............... H04M 1/6058 |
| | | | 455/575.2 |
| 2004/0047625 A1* | 3/2004 | Ito .......................... G03B 17/48 |
| | | | 396/429 |
| 2008/0164994 A1 | 7/2008 | Johnson et al. |
| 2009/0179768 A1* | 7/2009 | Sander ..................... H04M 1/05 |
| | | | 340/13.27 |
| 2009/0296952 A1 | 12/2009 | Pantfoerder et al. |
| 2011/0013780 A1* | 1/2011 | Yamkovoy ............. H04R 29/00 |
| | | | 381/58 |
| 2011/0170734 A1* | 7/2011 | Lim ..................... H04R 1/1041 |
| | | | 381/384 |
| 2012/0081102 A1* | 4/2012 | Gao et al. ................. 324/76.11 |
| 2012/0294454 A1* | 11/2012 | Sakamoto ............ H04R 1/1041 |
| | | | 381/66 |

OTHER PUBLICATIONS

Related European Patent Application No. 13156738.0, "Extended European Search Report" dated Jul. 17, 2013.
"Low-Power Headset Detectors with SEND/END Button Support", Maxim Integrated Products, Sunnyvale CA, 2012.

* cited by examiner

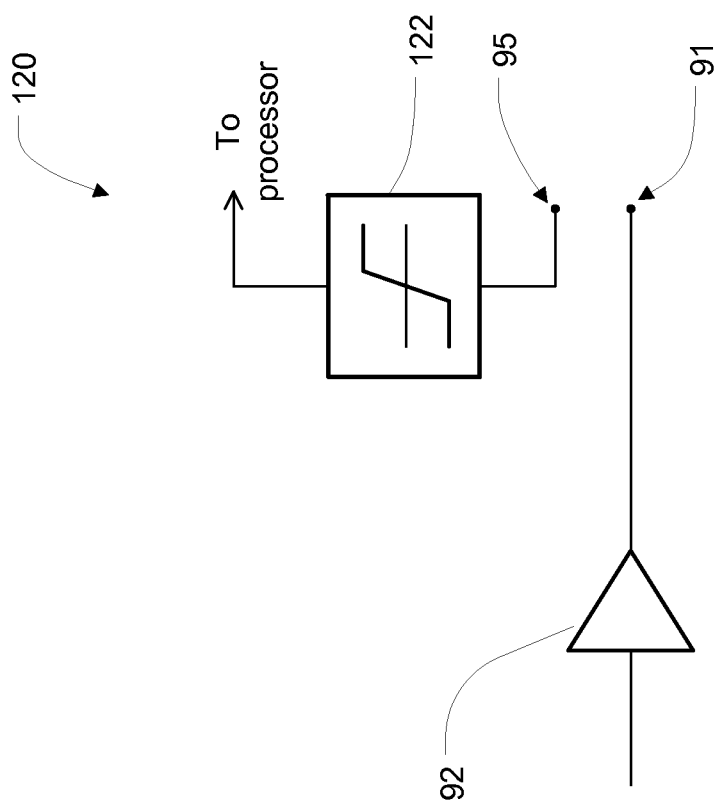

APPARATUS, SYSTEMS AND METHODS FOR DETECTING INSERTION OR REMOVAL OF AN AUDIO ACCESSORY FROM AN ELECTRONIC DEVICE

FIELD

Embodiments herein relate to electronic devices and in particular to apparatus, systems and methods for detecting the insertion or removal (or both) of an audio accessory, such as a headset, from an electronic device.

INTRODUCTION

Electronic devices, including portable electronic devices like smart phones and tablets, have gained widespread use and may provide a variety of functions including telephonic services, text messaging, playing media such as music and movies, and so on.

Electronic devices are often used with audio accessories such as microphones, standalone speakers, headsets or headphones (for purposes of illustration and explanation, audio accessories may be illustrated herein as headsets or headphones). Audio accessories may receive from the electronic device, or transmit to some electronic device (or both) audio information, which may include any signals related to audio, such as voice or music or other sounds, and any instructions or messages or control codes or other data related to the audio. For example, some electronic devices have audio jacks that are sized and shaped to receive a mating audio plug from a headset audio accessory. A user connects the headset audio accessory to the electronic device by inserting the audio plug on the headset into the audio jack on the electronic device. Once connected, audio can be output to the user by the audio accessory (e.g., via speakers on the audio accessory).

In some cases, audio accessories may incorporate a microphone to allow audio signals (e.g., speech) to be sent from the audio accessory to the electronic device. This may allow the user to make phone calls using the audio accessory, record voice memos, control the electronic device using voice commands, and so on.

In some cases, an audio accessory may include one or more buttons or other input devices to control the electronic device.

DRAWINGS

For a better understanding of the embodiments described herein, and to show how they may be carried into effect, reference will now be made, by way of example, to the accompanying drawings.

FIG. 12 is a schematic diagram of a detection circuit having a zero-crossing detector.

DESCRIPTION OF VARIOUS EMBODIMENTS

Figure 1:
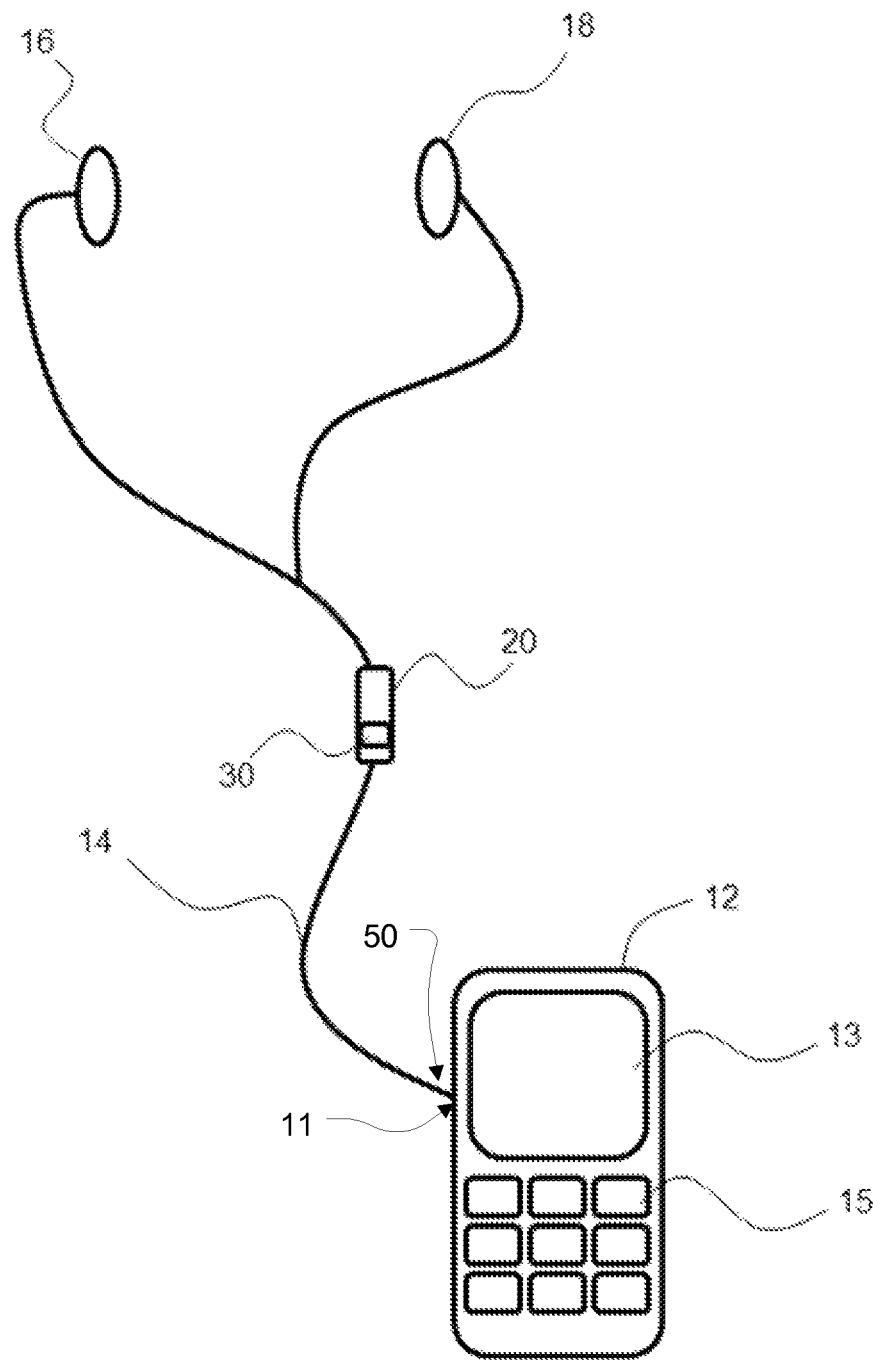
FIG. 1 is a schematic representation of an audio accessory coupled to an electronic device according to one embodiment.

Generally, some embodiments as described herein may be implemented on electronic devices, which may include a wide range of portable electronic devices that can be worn or carried by a human user, such as mobile phones, smart phones, personal digital assistants (PDAs), notebooks, laptops, digital audio/video players, digital audio/video recorders, tablet computers, and so on. The devices may be handheld, that is, sized and shaped to be held and carried in a human hand (although some handheld devices may be attached to clothing or otherwise worn during normal use). In some appropriate cases, however, the electronic devices may also include devices that are normally not worn or carried by a human user, for example a desktop computer, a stereo system, a vehicle audio system, and so on.

One aspect as described herein is directed to An electronic device for detecting an audio accessory, comprising an audio jack having at least two detection terminals, the detection terminals including an end terminal adapted to send audio information to a tip connector of the audio plug and another detection terminal spaced apart from the end terminal and positioned within the audio jack so when an audio plug of the accessory is inserted into the audio jack, the end terminal and other detection terminal will be shorted, and a detection circuit adapted to monitor the detection terminals, and when the detection circuit detects a short therebetween, indicate that the audio accessory is present.

The detection circuit may be adapted to apply a bias voltage to one of the detection terminals. The bias voltage may be applied to the end terminal and is outside of an output voltage range of an audio amplifier.

The detection circuit may include a current source adapted to send a current when the detection terminals are shorted. The detection circuit may include a tone generator coupled to one of the detection terminals and a tone detector coupled to the other of the detection terminals, the tone generator adapted to generate a tone, and wherein the tone detector detecting the tone is indicative of the presence of the accessory. The tone may be inaudible to a human.

According to another aspect an electronic device for detecting an audio accessory, comprising an audio jack having at least two detection terminals, the detection terminals being spaced apart and positioned within a socket of the audio jack so when an audio plug of the accessory is inserted into the socket of the audio jack, the detection terminals will be shorted, wherein the presence of a short between the detection terminals indicates that the audio accessory is present.

The detection terminals may be positioned within the socket so as to be shorted by the same connector of the audio plug. The detection terminals may include an end terminal adapted to send audio information to a tip connector of the audio plug and another detection terminal spaced apart from the end terminal.

A change in state of the short of the detection terminals is generally indicative of an insertion of the accessory or a removal of the accessory.

The terminals may be on opposite sides of a socket of the audio jack. The detection terminals may be at or near a tip-end of the socket and are adapted to be shorted by a tip connector of the audio plug.

In some embodiments, the electronic device includes a detection circuit adapted to cooperate with the detection terminals to detect the accessory. The detection circuit may be adapted to apply a bias voltage to one of the detection terminals. The bias voltage may be outside of an output voltage range of an audio amplifier coupled to another of the detection terminals. The detection circuit may include a current source adapted to send a current when the detection terminals are shorted.

The detection circuit may include a tone generator coupled to one of the detection terminals and a tone detector coupled to another of the detection terminals, the tone generator adapted to generate a tone, and wherein whether the tone detector detects the tone is indicative of the presence of the accessory. The tone may be inaudible to a human. In some embodiments, the tone is an ultrasonic tone.

In some embodiments, the detection circuit includes a zero-crossing detector coupled to a detection terminal opposite an audio amplifier, and wherein the zero-crossing detector is adapted to indicate that no accessory is present if no zero-crossing is detected within a particular time.

On some of electronic devices, especially portable electronic devices, computer resources (e.g., memory capacity, processing power and screen space) may be more limited than on other devices. A portable smart phone, for example, may generally have a smaller display and less memory capacity than a desktop computer, which may have a larger display and more memory.

The concepts as described herein are not necessarily limited to any particular kind of electronic device, but may be generally suitable for use on various electronic devices with various computer resources.

In some embodiments, the electronic device may be a portable electronic device, such as a smart phone with communications capabilities (e.g., voice, data, or both), over a data connection (e.g., a cellular network), and which is adapted to cooperate with an audio accessory (e.g., headphones). In this disclosure, elements may be described as "adapted to" perform or "adapted for" performing one or more functions. In general, an element that is adapted to perform a function is suitable for performing the function, or is configured to perform the function, or is operable to perform the function, or is otherwise capable of performing the function.

In general, it may be desirable to detect when an audio accessory is coupled to the electronic device. Specifically, it may be useful to know when an audio accessory is inserted into the electronic device, or removed from the electronic device (or both), as this knowledge can be used to selective trigger one or more actions, such as changing an operational state of the electronic device.

For instance, when an audio accessory is removed from the electronic device it may be desirable to terminate audio output through the audio jack, activate a speaker on the electronic device (e.g., for receiver or speakerphone mode), or take some other action. Alternatively, when an audio accessory is inserted into the electronic device, it may be desirable to switch to an "accessory" or "headphone" mode, initiate audio playback via the audio jack, deactivate a speaker on the electronic device, and so on.

In order to detect the insertion or removal (or both) of audio accessories from the audio jack, various approaches may be used.

One approach uses a detection pin positioned within the audio jack on the electronic device. The detection pin senses the insertion or removal of an audio accessory via a moveable switch. In particular, the detection pin has at least one movable element, and the insertion or removal of the audio plug causes that element to move to either open or close an electrical circuit (depending on the particular configuration). This opening and closing is interpreted (e.g., by a processor on the electronic device) as either an insertion event or a removal event depending on the particular configuration.

For example, in a "normally open" configuration, the movable element is normally not in electrical contact with another terminal and the electrical circuit is open. However, when the audio accessory is inserted into the electronic device, the movable element will move into electrical contact with another terminal, closing the electrical circuit. This will be registered by the electronic device as an insertion event. Similarly, when the audio accessory is removed, the electrical connection between the terminals will be broken, registering the removal event.

Alternatively, in a "normally closed" configuration, a first and second terminal may be in electrical contact until the audio accessory is inserted into the audio jack. The action of inserting the audio accessory will break this electrical contact, opening the circuit, which will be registered as an insertion event. Similarly, when the audio accessory is removed, the terminals will return to being in electrical contact, closing the circuit and registering a removal event.

Unfortunately, using such a movable element within an audio jack may be problematic. In particular, lint, dust, sand or various other types of particles or contaminants can enter the audio jack and can become lodged between the terminals of the detection pin, or otherwise interfere with the movement of the movable element, which can result in detection failures. This failure mode can be quite common, and up to 2% or more of electronic devices may experience this condition. When such a failure happens, it may no longer be possible to properly detect the insertion or removal of an accessory by use of information from the detection terminal, which can negatively impact the performance of the electronic device.

Accordingly, at least some embodiments herein are directed at improved techniques for detecting whether an audio accessory is coupled to an electronic device, particularly for detecting the insertion or removal (or both) of an audio accessory.

In one aspect, an audio jack is configured with at least two detection terminals, which may be located at or near the tip-end of the socket of the audio jack. The detection terminals are spaced apart, and in some embodiments may be on opposite sides of the socket.

The detection terminals are positioned so when an audio accessory is coupled to the electronic device, the audio plug of the accessory will be in electrical contact with both terminals. More particularly, the same electrical contact on the audio plug (e.g., namely either the tip, ring or sleeve) will be in electrical contact with both terminals. That electrical contact thus provides a short circuit between the detection terminals. As used herein, a shorting refers to the creation or presence of a short circuit. Generally speaking, shorting refers to two nodes being electrically connected such that their voltages are substantially equal to one another.

Shorting includes not only strict shorting, in which the two nodes are electrically connected by being brought in directly in electrical and physical contact with one another, but also substantial shorting, in which one or more intermediate elements (typically having negligible impedance) bridges the two nodes.

The detection terminals can be monitored, and when a short circuit (or simply a short) between the detection terminals exists, the short can be detected (in some cases using one or more detection circuits as described below). Detection of a short, or lack of detection of a short, can be used to determine whether an audio accessory has been inserted or removed.

More generally, the presence of a short between the detection terminals suggests that an audio accessory is present, while the absence of a short suggests that no audio accessory is present. A change in state (e.g., from detecting a short to not detecting a short, and vice versa) can be used as an indicator of a particular removal or insertion event.

In some embodiments, the detection terminals are provided at or near the tip end of the socket. In such cases, the tip contact of the audio plug will short the detection terminals. Positioning the detection terminals in this location can be beneficial as a short will generally only occur between the detection terminals when the audio plug is fully inserted within the audio jack. In contrast, although it is possible for the detection terminals to be positioned elsewhere within the socket (e.g., to be shorted by the sleeve of a TRS jack), this configuration can lead to false reads that may occur if either the tip contact or ring contact temporarily shorts the detection terminals as the audio plug is inserted.

Since the detection terminals are spaced apart within the socket (in some cases on opposite sides of the socket), it is less likely that particles (e.g., lint or dirt) will become stuck in between the terminals in a manner that interferes with the detection of the audio accessory. Generally speaking, the detection terminals are spaced apart in that there is a gap between them such that they are not in physical contact with one another, although the distance of the gap is not necessarily the same in all implementations.

In some embodiments, a detection circuit cooperates with the detection terminals to detect the insertion or removal of an audio accessory (e.g., by monitoring the detection terminals and detecting the short).

In particular, in some cases, the end terminal in an audio jack (which is designed to make electrical contact with the tip contact of the audio plug to send audio signals to the accessory) may be used as one of the detection terminals. In other cases, the detection terminals may be separate from the end terminal (although the detection terminals and end terminal may all be in contact with the tip contact at the same time).

Since the end terminal is normally used to carry left channel audio information to an audio accessory, the end terminal normally does not have a fixed voltage. As such, the end terminal will often carry an audio signal with a voltage that can interfere with the detection of the accessory via the detection terminals. Thus, without a suitably configured detection circuit, false insertion or removal events (or both) might be registered (depending on the audio signal being sent through to the tip connector of the audio plug).

One such detection circuit may bias the detection terminals using a voltage source with high output impedance and with an output voltage (higher or lower) that is outside of the normal output voltage range of the audio amplifier that drives the left channel. Accordingly, an observed detection voltage can be checked using a voltage comparator. When a detection voltage is observed that is higher or lower than any output normally possible from the audio amplifier, a fairly reliable prediction can be made about the status of the audio accessory, despite large voltage variations that might be present in the audio output signal on the left channel.

In some embodiments, a controlled current source may be coupled to the output on the left channel. When the detection terminals are connected, a well-defined current will run into the audio amplifier. However, when the detection terminals are disconnected (e.g., the accessory is unplugged) this current source will be unable to send out this current, and the output will immediately swing to the voltage rails. This swing can be detected by direct observation or from a control voltage of the current source.

In another embodiment, it may be possible to use inaudible tones (e.g., ultrasonic tones) to detect the presence or absence of the accessory. More particularly, an ultrasonic tone (e.g., a 32.768 kHz tone) may be generated and applied to one of the detection terminals, while the other detection terminal is monitored. If the ultrasonic tone is detected at the second terminal, this indicates that the two terminals have been shorted and an audio accessory has been inserted. In some embodiments the high frequency tone may be output directly through the audio amplifier.

In some embodiments, it may also possible to exploit the fact that most audio amplifiers are AC-coupled at the input, and therefore will have a low output voltage (or zero-crossing) within a finite amount of time T. Thus, the presence of a zero-crossing can be monitored at the detection terminal opposite the audio amplifier; if no zero-crossing is observed within a particular amount of time (e.g., within 100 milliseconds), this indicates that the detection terminals are not shorted and no audio accessory is inserted.

In some embodiments, zero-crossings could be detected using a slow threshold detector with a time constant slower than the input filter and with a detection threshold close to either the higher or lowest supply voltage of the audio amplifier. In this case, a high output impedance voltage source may be coupled to one of the detection terminals.

In some embodiments, one or more special pulsing methods may be to detect the presence of multiple different audio plug configurations (e.g., TRS, TRRS, etc.). For example, inaudible waveforms may be used during detection to avoid unpleasant artifacts. This can be generated using pulses with an energy content lower than the human threshold, or with a frequency that is outside of the human hearing range (which is normally between approximately 20 Hz to 20,000 Hz). These pulses may be shaped in such a way that during the transition of turning on and off these pulses no audible artifacts occur. This may be done, for example, by slowly turning on and off the excitation of these waveforms to ensure that any energy content within the human hearing frequency range is sufficiently low so as to be generally inaudible.

During detection, it may be necessary to disconnect any loads from the detection terminals during a detection sequence. In some cases this may be done using a switch or by making the resistance value of the external load sufficiently large such that it will not be detected as a valid load at the insertion detection terminal when nothing is connected.

Reference is now made to FIG. 1, which is a schematic diagram illustrating an electronic device 12 and an audio accessory 14 coupled thereto via an audio jack 11.

The electronic device 12 may include any suitable electronic device, such as a portable smart phone having a display 13, and which may include a memory, a processor, a communications system for communicating over a wireless network (e.g., a cellular network, a Wi-Fi network, etc.) and other functional components as will be generally understood.

In some embodiments, the electronic device 12 may have a physical keyboard 15 (as shown). In some embodiments, the electronic device 12 may include a touchscreen device, optionally with or without a physical keyboard 15.

In this embodiment the audio accessory 14 is a stereo headphone having two speakers (e.g., a right speaker 16 and a left speaker 18), although in other embodiments a different number of speakers could be present. The speakers 16, 18 of the audio accessory 14 are generally operable to output audio content, such as music, speech, and so on.

In this embodiment, the audio accessory 14 also includes a user control interface 20 for controlling aspects of the electronic device 12 (e.g., audio volume, changing music tracks, etc.), although in other embodiments no control interface 20 may be present.

In some embodiments, the audio accessory 14 may be a headset that includes a microphone 30 for receiving audio signals (e.g., a user's voice) and for sending those audio signals to the electronic device 12. As shown, in some embodiments the microphone 30 may be provided with the user control interface 20. Alternatively, the microphone 30 may be provided at another location on the audio accessory 14.

Figure 8:
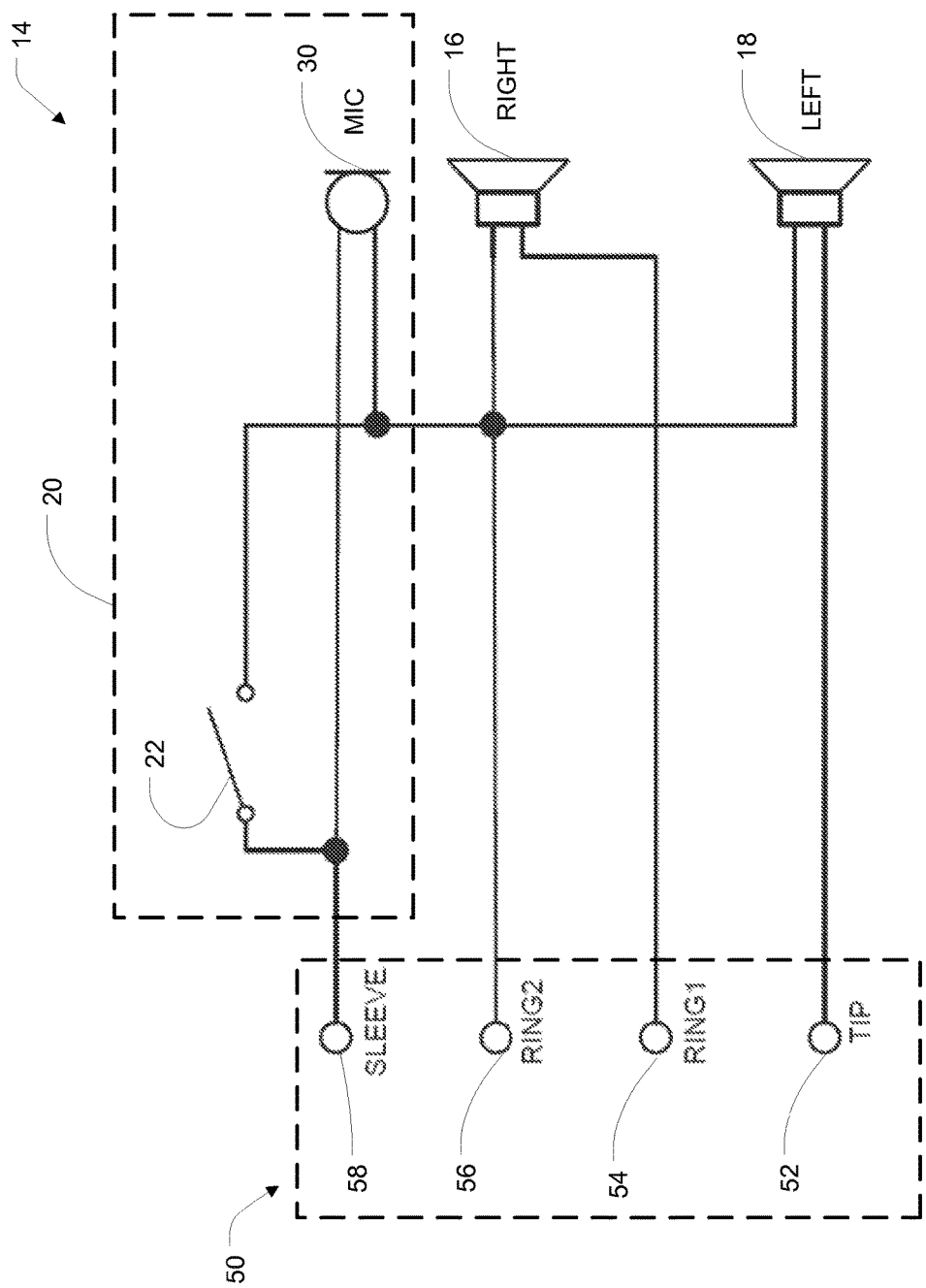
FIG. 8 is a schematic diagram of the accessory of FIG. 1.

As shown in FIG. 8, in some embodiments the control interface 20 may include a switch 22 that is adapted to short the microphone 30 to send control signals to the electronic device 12. In other embodiments, the control interface 20 may have various other control schemes.

In some embodiments, the audio accessory 14 is connected to the electronic device 12 using an audio plug 50 on the audio accessory 14 that mates with a corresponding audio jack 11 on the electronic device 12. In some embodiments, the plug 50 and jack 11 can be of the tip-ring-sleeve (TRS) variety, or a tip-ring1-ring2-sleeve (TRRS) variety, or other various types. For example, some audio connectors are in the form of 3.5 mm (⅛") miniature plugs and jacks, or other sizes such as 2.5 mm connectors and ¼" connectors. In headsets and other accessories, these audio connectors are generally used to carry audio signals and other information between the speakers 16, 18, the microphone 30 and the electronic device 12.

As discussed above, it may be beneficial to detect when the audio accessory 14 is inserted into, or removed from, the electronic device 12 (or both). In particular, the presence or absence of the audio accessory 14 may be used to trigger the change of an operational state of the electronic device 12 (e.g., switching to speakerphone mode, pausing or resuming audio playback via the audio jack 11, and so on).

Figure 2:
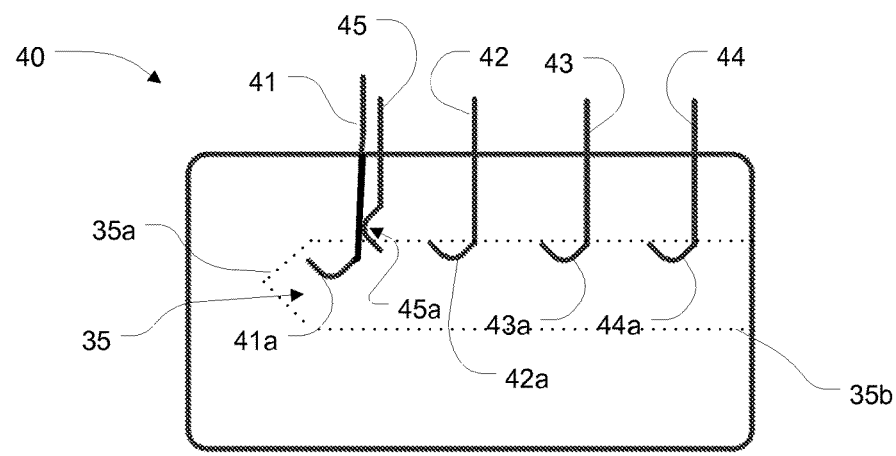
FIG. 2 is a schematic diagram of an audio jack with a movable element adapted to detect an audio accessory.
Figure 3:
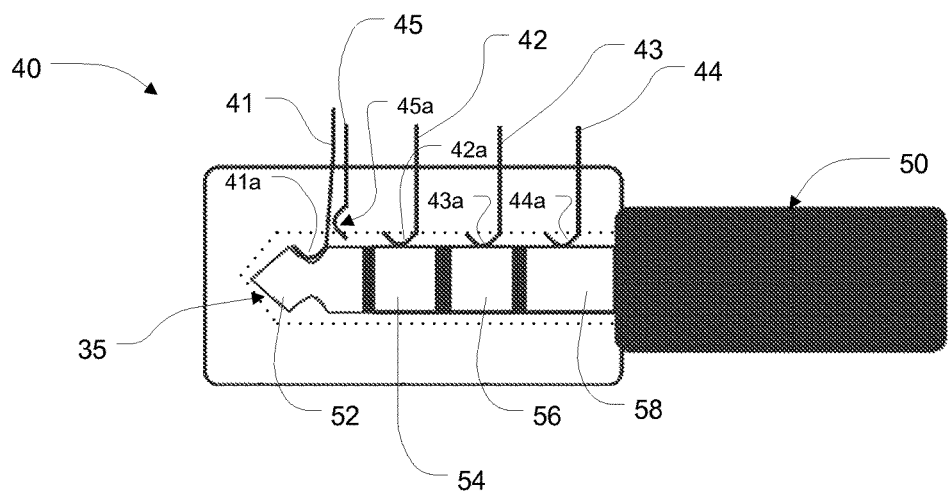
FIG. 3 is a schematic diagram of an audio plug received in the audio jack of FIG. 2.

Accordingly, turning now to FIGS. 2 and 3, illustrated therein is an audio jack 40 adapted for detecting the insertion or removal of an audio accessory using a movable element. As shown, the audio jack includes a socket 35 that can generally be defined as having a tip-end 35a and an open end 35b. The socket 35 is adapted to receive an audio plug 50 via the open end 35b, and when fully inserted the tip contact 52 of the audio plug 50 will generally be at or near the tip-end 35a of the socket 35.

The audio jack 40 includes a plurality of operational terminals adapted to make electrical contact with the audio plug 50 of the audio accessory. In particular, the audio jack 40 includes an end terminal 41 adapted to make electrical contact with the tip contact 52 of the audio plug 50, a ring1 terminal 42 adapted to make electrical contact with the ring1 contact 54, a ring2 terminal 43 adapted to make electrical contact with the ring2 contact 56, and a sleeve terminal 44 adapted to make electrical contact with the sleeve contact 58. More particularly, each terminal 41, 42, 43 and 44 has an end portion 41a, 42a, 43a, and 44a, respectively, adapted to be in physical contact with the contacts 52, 54, 56 and 58 when the audio plug 50 is received within the socket 35 (as shown in FIG. 3).

As shown, the audio jack 40 also includes a detection pin 45, which in this embodiment is a "normally closed" detection pin. In particular, as shown in FIG. 2, without the audio plug 50 a contact terminal 45a of the detection pin 45 is in electrical contact with the end terminal 41. Accordingly, an electrical circuit between the detection pin 45 and the end terminal 41 is closed.

However, in this embodiment the end terminal 41 is a movable element. When the audio plug 50 is inserted into the socket 35, the tip contact 52 of the audio plug pushes the end terminal 41 and breaking the electrical contact between the end terminal 41 and the detection pin 45.

This change in state can be used to indicate that the audio accessory has been inserted into the electronic device. However (as discussed above) lint, dust or other particles can enter the audio jack 40, and may become stuck between the detection pin 45 and the end terminal 41, thus inhibiting the formation of an electrical circuit. Alternatively, such particles can interfere with the movement of the end terminal 41. Both of these issues can result in detection failures in which the insertion or removal of an audio accessory may not be properly recognized.

Figure 4:
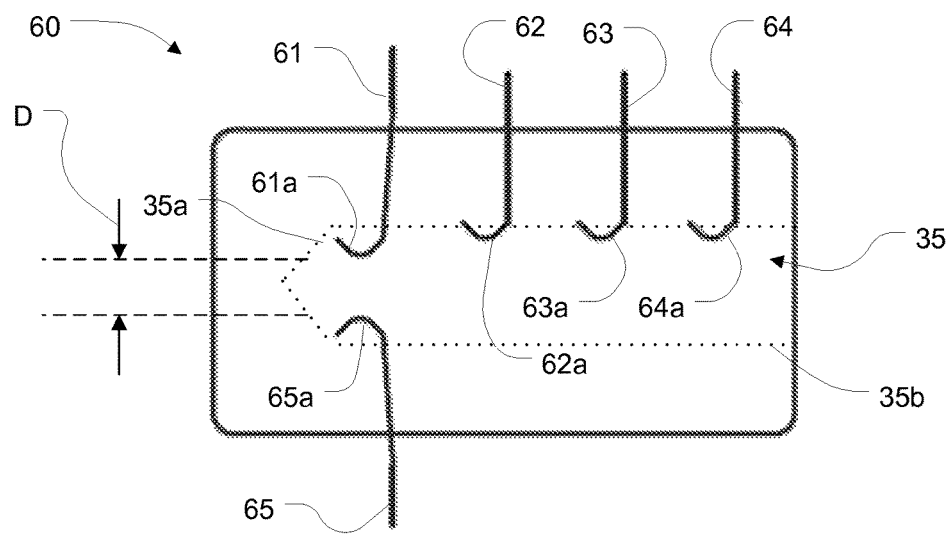
FIG. 4 is a schematic diagram of an audio jack according to one embodiment.
Figure 5:
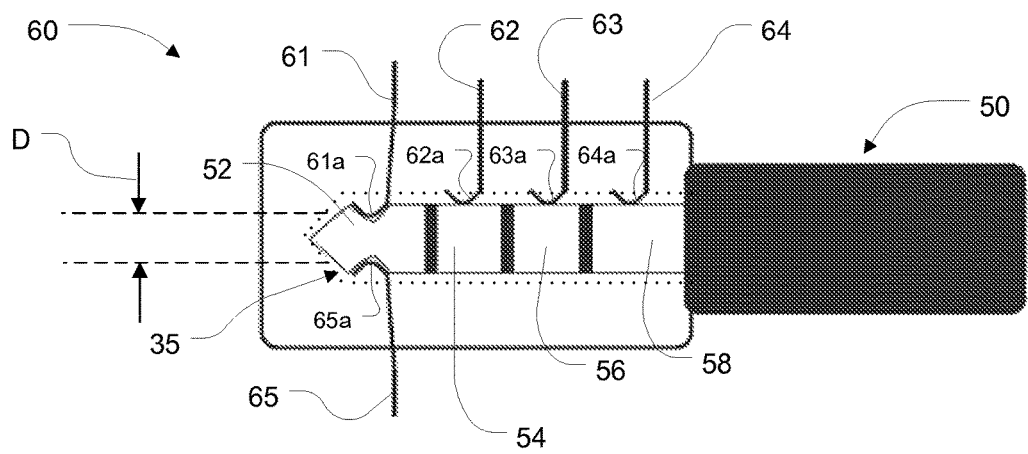
FIG. 5 is a schematic diagram of an audio plug received in the audio jack of FIG. 4.

Turning now to FIGS. 4 and 5, illustrated therein is an audio jack 60 according to one embodiment. The audio jack 60 includes a plurality of operational terminals adapted to make electrical contact with the audio plug 50. In particular, the audio jack 60 includes an end terminal 61 with a portion 61a adapted to make electrical contact with the tip contact 52, a ring1 terminal 62 with a portion 62a adapted to make electrical contact with the ring1 contact 54, a ring2 terminal 63 with a portion 63a adapted to make electrical contact with the ring2 contact 56, and a sleeve terminal 64 with a portion 64a adapted to make electrical contact with the sleeve contact 58.

In this embodiment, the end terminal 61 serves as a first detection terminal, and the audio jack 60 also includes a second detection terminal 65, having a portion 65a adapted to also make contact with the tip contact 52 of the audio plug 50. The end portions 61a and 65a of the detection terminals 61, 65 are spaced apart by a gap distance D. In general, the gap distance D may be selected to inhibit dust, lint, or other particles from becoming lodged therebetween. Typical gap distances may be on the order of a few millimeters, but there is no specific minimum or maximum distance. In some embodiments, the end portions 61a and 65a of the detection terminals 61, 65 are on opposing sides of the socket 35 (as suggested by the figures; the detection terminals 61, 65 may be, but need not be, diametrically opposed) so as to increase the distance therebetween.

As shown in FIG. 5, when the audio plug 50 is received in the audio jack 60, the tip contact 52 is in electrical contact with both detection terminals 61, 65. Thus, a short is created between the detection terminals 61, 65, and which is indicative of the presence of the audio plug 50.

In this embodiment, the detection terminals 61, 65 are provided at or near the tip-end 35a of the socket 35. Accordingly, the detection terminals 61, 65 will generally only indicate the presence of an audio plug 50 when the audio plug 50 is fully received within the audio jack 60.

In other embodiments, the detection terminals may be provided at other locations within the socket 35, although this may increase the chance of misreads. For instance, the ring2 terminal 63 could be used as a first detection terminal with a second detection terminal positioned opposite thereto within the socket 35.

Figure 6:
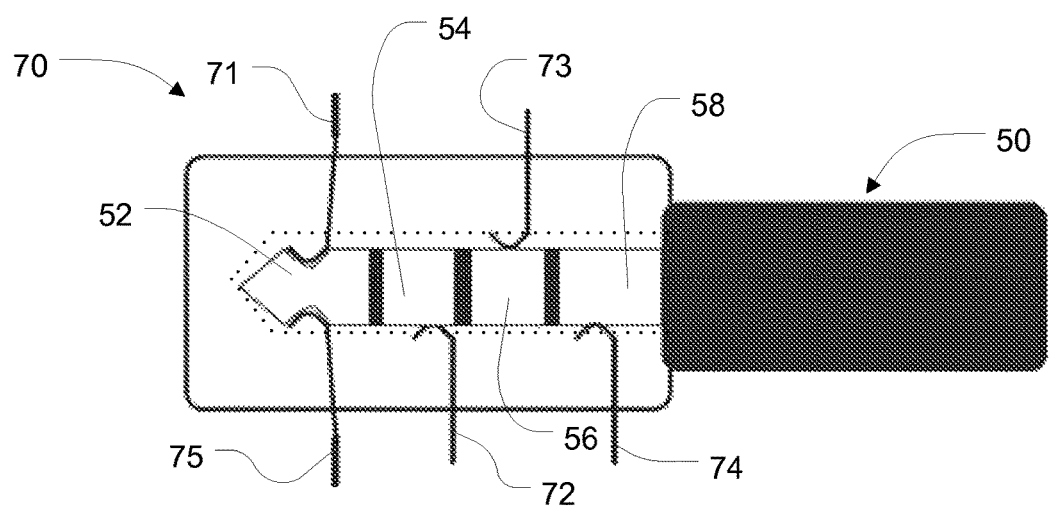
FIG. 6 is a schematic diagram of an audio jack according to another embodiment.

Turning now to FIG. 6, illustrated therein is a schematic diagram of an audio jack 70 according to another embodiment.

The audio jack 70 is generally similar to audio jack 60 and includes a plurality of operational terminals adapted to make electrical contact with the audio plug 50. In particular, the audio jack 70 includes an end terminal 71, a ring1 terminal 72, a ring2 terminal 73, and a sleeve terminal 74. In this embodiment, the end terminal 71 serves as a first detection terminal, and a second detection terminal 75 is provided in a spaced apart relationship thereto.

In this embodiment, however, the operational terminals are positioned with a different pattern. In particular, the end terminal 71 and ring2 terminal 73 are provided on a first side of the socket 35, while the detection terminal 75, ring1 terminal 72 and sleeve terminal 74 are provided on the opposite side. In general, terminals 71, 72, 73, 74 and 75 can be placed on the same side of a connector, or some of the terminals 71, 72, 73, 74 and 75 may be placed on the opposite side, or different embodiments some of the terminals 71, 72, 73, 74 and 75 may be placed below or above (or both) the terminals placed on the side of the socket.

Figure 7:
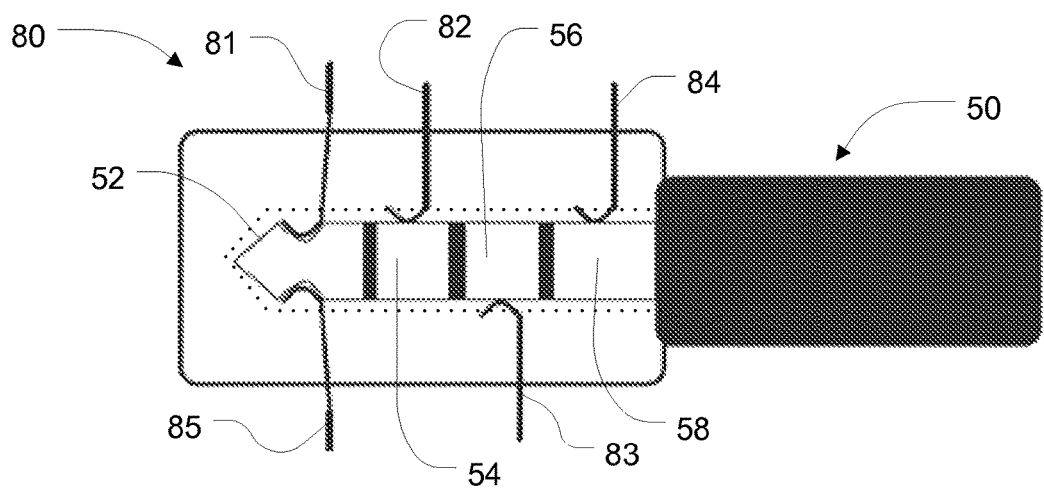
FIG. 7 is a schematic diagram of an audio jack according to another embodiment.

Turning now to FIG. 7, illustrated therein is another audio jack 80. The audio jack 80 is generally similar to audio jack 60 and includes an end terminal 81, a ring1 terminal 82, a ring2 terminal 83, and a sleeve terminal 84. In this embodiment, the end terminal 81 serves as a first detection terminal, and a second detection terminal 85 is provided in a spaced apart relationship thereto.

In this embodiment, the end terminal 81, ring1 terminal 82 and sleeve 84 are provided on a first side of the socket 35, while the detection terminal 85 and ring2 terminal 73 are provided on the opposite side. There may be benefits with respect to this embodiment in that the physical size of the connector may be reduced by placing the terminals on either side of the socket, thereby making one or more of the physical dimensions of width, height, or length smaller. Furthermore, by placing terminals on opposite sides of the connector, the inserted jack connector will tend to become more centered and thereby may make a more reliable contact to the detection terminals.

Turning now to FIG. 8, illustrated therein is a schematic diagram of the accessory 14 of FIG. 1, including the control interface 20 with the switch 22 for shorting the microphone 30 line. Also shown is the configuration of the audio plug 50 according to one possible embodiment, although in some cases other configurations for the pin connections may be possible. For example, the audio plug 50 shown here has a TRRS arrangement, and a different configuration would be provided in a TRS accessory. In some embodiments, the signals to the microphone 30 may be filtered in order to provide better immunity towards external interference (e.g., by using beads coupled in series with the signal lines or capacitors in parallel with the microphone). In other embodiments, the microphone 30 may include ESD protection, for example using a varistor or similar protection component.

Figure 9:
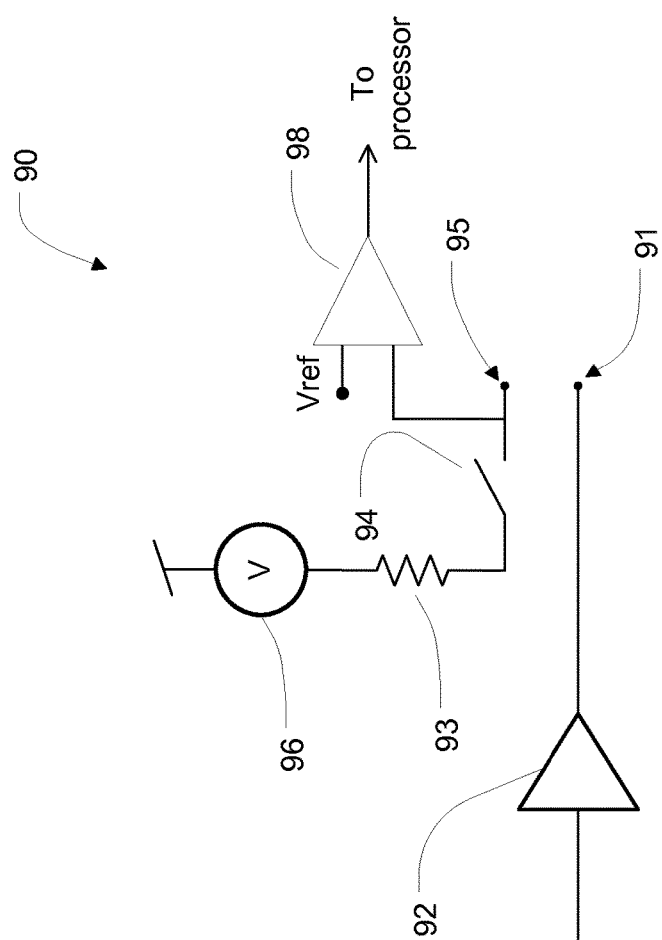
FIG. 9 is a schematic diagram of a detection circuit adapted to apply a bias voltage across the detection terminals.

Turning now to FIG. 9, illustrated therein is a schematic diagram of a detection circuit 90 for use with detection terminals as generally described herein. The detection circuit 90 is an example of a circuit that can monitor the detection terminals.

In particular, an end terminal (e.g., end terminal 61 as shown in FIG. 5) is normally used to carry left channel audio information to the audio accessory (e.g., audio accessory 14) via the tip connector 52. As such, the end terminal normally does not have a fixed voltage, and can carry an audio signal with a voltage that can interfere with the detection of the audio accessory via the detection terminals. Thus, a suitably configured detection circuit can help to avoid signaling of false insertion or removal events that might be registered depending on the audio signal being sent through to the tip connector.

As shown, the detection circuit 90 includes a first detection terminal 91, which could be the end terminal 61, and a second detection terminal 95, which could be the detection terminal 65.

In this embodiment, the detection circuit 90 is adapted to apply a bias voltage across the detection terminals 91, 95. In particular, a bias voltage may be applied to the first detection terminal 91 using a voltage source 96. The voltage experienced by the second terminal 95 can be monitored, for example using a voltage comparator 98.

More particularly, the voltage source 96 may bias the detection terminal 91 with a voltage that is outside of the output voltage range of the audio amplifier 92.

In particular, if the audio amplifier 92 has a maximum output voltage of +1.8V, the bias voltage applied by the voltage source 96 may be set to +3V or higher. Furthermore, the voltage comparator 98 could be coupled to a reference voltage of approximately +2.4V. These voltages could have other values as long as the bias voltage is outside the normal range of operation of the audio amplifier so that threshold between these values can be made.

Accordingly, when a detection voltage is observed at the second detection terminal 95 that exceeds the maximum normal output voltage of the amplifier 92, the voltage comparator 98 can indicate that an audio accessory is present. The detection circuit 90 may indicate the detection of the presence of an audio accessory in any fashion, such as by generating or interrupting or varying or otherwise sending a signal (e.g., to a processor) indicating that the accessory has been detected. In this manner, the detection circuit 90 should provide a relative a reliable prediction about the status of the accessory, despite large voltage variations that might occur over the audio channel.

In some embodiments, the detection circuit 90 can include a switch 94 for selectively activating and deactivating the detection circuit 90. In particular, the presence of the detection circuit 90 may in some cases interfere with the quality of the audio being sent to the audio accessory. Accordingly, the detection circuit 90 may be operable to deactivate the bias voltage (e.g., the voltage source 96) when an audio accessory is detected. In some such cases, the detection circuit 90 may be periodically activated to check and see whether the accessory has been removed (e.g., once per second, once every ten seconds, etc.)

Figure 10:
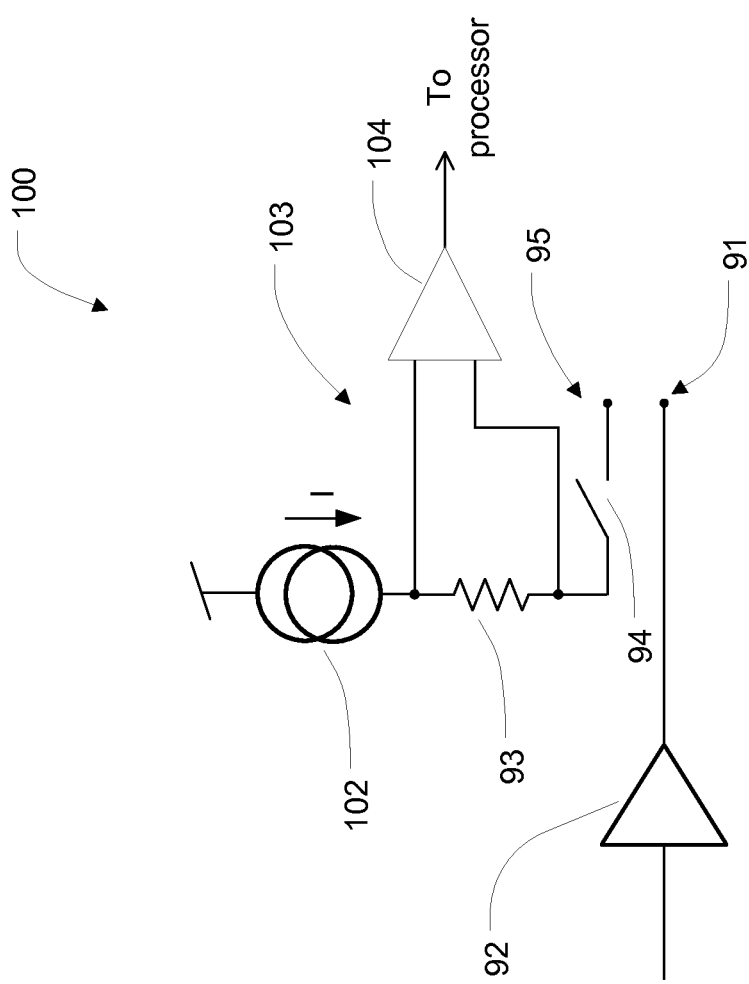
FIG. 10 is a schematic diagram of a detection circuit adapted to send a current across the detection terminals.

Turning now to FIG. 10, illustrated therein is a detection circuit 100 according to another embodiment. In this embodiment, a controlled current source 102 is coupled to detection terminal 95. When the detection terminals 91, 95 are connected (e.g., when the accessory is inserted), a current will run into the audio amplifier 92, which can be detected by a current detector 103 (e.g., which may include a comparator 104 and resistor 93).

However, when the detection terminals 91, 95 are disconnected (e.g., the accessory is unplugged) this current source 102 will be unable to send out the current to the amplifier, and the output will swing to the voltage rails. This swing can be detected by direct observation or from a control voltage of the current source, and used to indicate that no accessory is present in the audio jack.

Figure 11:
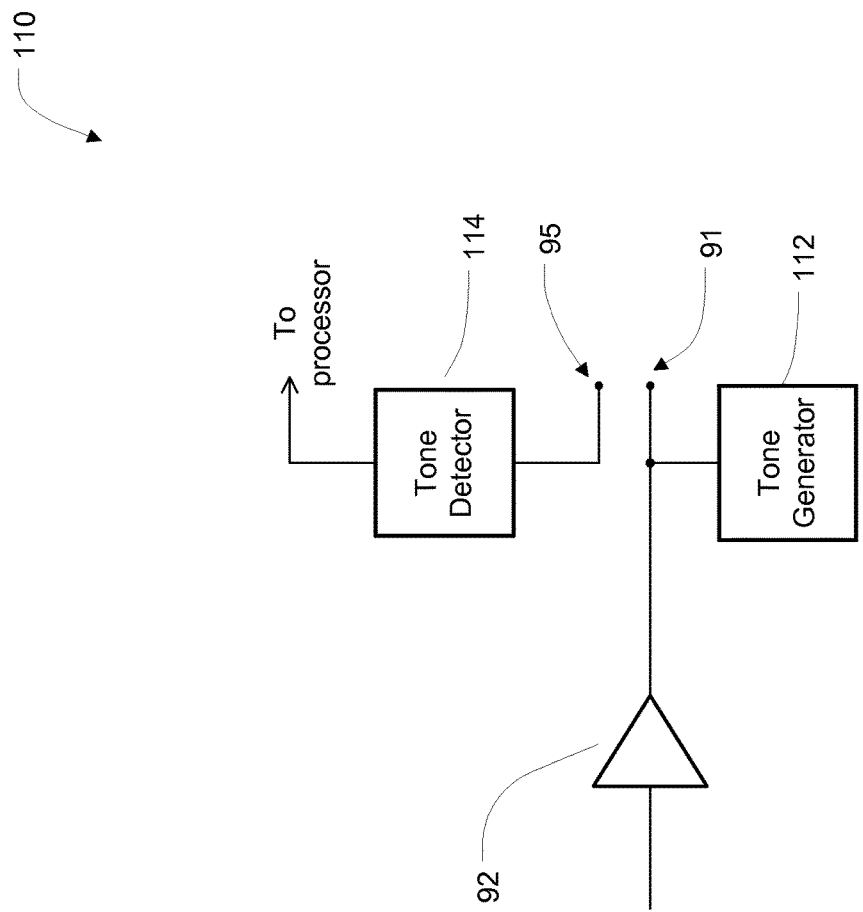
FIG. 11 is a schematic diagram of a detection circuit adapted to send an inaudible tone across the detection terminals.

Turning now to FIG. 11, illustrated therein is a detection circuit 110 according to another embodiment. The detection circuit 110 is another example of a circuit that can monitor the detection terminals and detect a short between the detection terminals. In this embodiment, a tone generator 112 is coupled to one of the detection terminals (e.g., detection terminal 91), while a tone detector 114 is coupled to the other detection terminal (e.g., the detection terminal 95). The tone generator 112 generates one or more tones (e.g., particular inaudible tones, such as ultrasonic tones with a frequency greater than 20 kHz). If the tone detector 114 detects these tones, this is an indication that the detection terminals 91, 95 have been shorted and that an accessory is present. The detection circuit 90, such as via the tone detector 114, may indicate (e.g., to a processor) that the audio accessory is present when the short is detected. The detection circuit 90 may also indicate that the audio accessory is absent when the short is absent.

In some embodiments, the inaudible tone(s) may further be modulated with a slower envelope signal (e.g., 100 Hz) to help suppress audible clicks that may be otherwise observed due to the transient conditions occurring immediately at the first contact during insertion.

In some embodiments, to lower power consumption, the ultrasonic signal may only be emitted once in a while (e.g., once per second, once every ten seconds, etc.) and with a low duty cycle. In some embodiments, the audio amplifier 92 may be used to generate or output the ultrasonic signals.

In some embodiments, the tones may have various configurations so as to avoid possible pops, clicks or other audio artifacts. In particular, the tones may be ultrasonic tones with energy levels selected so as to be generally inaudible to a human user. In some embodiments, the tone detector 114 may include synchronized demodulation and low pass filtering in order to protect against noise and thereby enable low amplitude levels to be used for the ultrasonic tone.

Turning now to FIG. 12, illustrated therein is a detection circuit 120 according to another embodiment. In this embodiment, a zero-crossing detector 122 is coupled to the detection terminal 95 on the opposite side of the amplifier 92.

Since most audio amplifiers are AC-coupled, they will tend to generate a zero-crossing within a finite amount of time T. The zero-crossing detector 122 can thus monitor the second detection terminal 95. If no zero-crossing is observed (or no low amplitude value below a given offset or hysteresis) within a particular amount of time (e.g., 10 milliseconds, 100 milliseconds, etc.), this indicates that the detection terminals 91, 95 are not shorted and no audio accessory is inserted.

In some embodiments, the detection terminal 95 may be connected to a voltage or current source to ensure sufficient margin against noise (similar to the configurations shown in FIG. 9 and FIG. 10).

In some embodiments, the zero-crossing detector 122 could be a slow threshold detector with a time constant slower than the input filter and with a detection threshold close to either the higher or lowest supply voltage of the audio amplifier 92.

In general, the teachings herein may provide for an improved approach to detecting whether an audio accessory is coupled to an electronic device. More particularly, the teachings herein may be useful to detect when an audio accessory is inserted into an electronic device, or removed from an electronic device, or both.

In general, concerns about lint, dust and other particles or contaminants can be at least partially addressed by spacing apart two or more detection terminals, making it difficult for them to be affected by contaminants. When an audio plug is received in the audio jack, the plug will short these terminals and indicate that the audio accessory is coupled to the electronic device.

Even with this terminal arrangement, however, it may be difficult to detect an audio accessory, especially when an audio signal is active (e.g., music is being played). Accordingly, one or more detection circuits may be used to ensure that the detected signals at the detection terminals are indicative of the presence of an audio accessory.

When an audio accessory is detected, and in particular when an insertion event or removal event is detected, this information can be used to determine whether the electronic device should make an operational change (e.g., generating an alert, activating or deactivating a speaker, power up an electronic device or a component thereof, etc.)

The teachings herein may provide one or more potential advantages as compared to prior approaches to accessory detection, some of which have been mentioned or suggested already.

For instance, in some cases, the teachings herein may provide for a robust and economical system that may be adaptable to wide number of accessory configurations.

Moreover, the detection terminals and detection circuitry may not take up significant amounts of space within a portable electronic device (where space is often at a premium) or consume much power on a portable electronic device (where battery life may be a significant concern).

Furthermore, at least some embodiments may allow for the detection of an audio accessory regardless of whether an audio signal is present (e.g., music is playing) or not. Such a capability may represent a notable user convenience.

The foregoing aspects of the systems, methods and electronic devices are provided for exemplary purposes only. Those skilled in the art will recognize that various changes may be made thereto without departing from the scope of the method and the electronic device as defined by the appended claims.

The invention claimed is:

1. An electronic device for detecting an audio accessory, comprising:
   an audio jack having two detection terminals, the two detection terminals being spaced apart and positioned within a socket of the audio jack, wherein when an audio plug of the accessory is inserted into the socket of the audio jack, the two detection terminals electrically contact a connector of the audio plug;
   a detection circuit comprising a first terminal coupled to one of the two detection terminals, a second terminal coupled to the other of the two detection terminals, a switch coupled between a voltage source and the second terminal, the detection circuit configured to:
      activate the switch to connect the voltage source to the second terminal to apply a bias voltage across the first and second terminals, the bias voltage being outside of an output voltage range of an audio amplifier of the electronic device;

monitor a voltage at the second terminal and generate a signal when the first and second terminals are shorted by the detection terminals of the audio jack electrically contacting the connector of the audio plug and the voltage at the second terminal exceeds the output range of the audio amplifier, the signal indicating that the audio plug of the audio accessory is inserted into the audio jack; and, deactivate the switch to disconnect the voltage source from the second terminal to discontinue applying the bias voltage across the first and second terminals when the signal is generated.

2. The electronic device of claim 1, wherein the two detection terminals are positioned within a socket of the audio jack.

3. The electronic device of claim 1, wherein the two detection terminals include an end terminal configured to contact and send audio information to the connector of the audio plug, wherein the connector of the audio plug is a tip connector.

4. The electronic device of claim 1, wherein the detector circuit is further configured to, selectively activate the switch to connect the voltage source to the second terminal to apply the bias voltage to across the first and second terminals and generate a further signal indicative of removal of the audio plug of the audio accessory from the audio jack when the switch is activated and the first and second terminals are no longer shorted.

5. The electronic device of claim 1, wherein the two detection terminals are on opposite sides of the socket of the audio jack.

6. The electronic device of claim 1, wherein the two detection terminals are at or near a tip-end of the socket.

7. The electronic device of claim 1, wherein the audio jack comprises:
a ring1 terminal positioned on a first side of the socket and configured to electrically contact with a ring1 contact of the audio plug of the audio accessory; and
a ring2 terminal positioned on one of a first side and the second side of the socket and configured to electrically contact with a ring2 contact of the audio plug of the audio accessory; and
a sleeve terminal positioned on one of the first side and the second side of the socket and configured to electrically contact with a sleeve contact of the audio plug of the audio accessory.

8. An electronic device for detecting an audio accessory, comprising:
an audio jack comprising:
an end terminal configured to electrically contact and send audio information to a tip connector of an audio plug of the audio accessory when the audio plug of the audio accessory is inserted into the audio jack; and
a detection terminal spaced apart from the end terminal and positioned within the audio jack to electrically contact the tip connector of the audio plug when the audio plug of the audio accessory is inserted into the audio jack; and
a detection circuit comprising:
a first terminal connected to the end terminal;
a second terminal connected to the detection terminal;
a controlled current source connected to the second terminal via a switch to provide current to an audio amplifier connected to the first terminal when the switch is activated and the first and second terminals are shorted by the tip connector of the audio plug electrically contacting the end terminal and the detection terminal;
a current detector configured to detect the current provided to the audio amplifier and generate a signal indicative of insertion of the audio plug of the audio accessory into the audio jack when the switch is activated and the first and second terminals are shorted by the tip connector of the audio plug electrically contacting the end terminal and the detection terminal.

9. The electronic device of claim 8, wherein the current detector is further configured to generate a further signal indicative of removal of the audio plug of the audio accessory from the audio jack while the switch remains activated and the current detector discontinues detecting the current provided to the audio amplifier.

10. The electronic device of claim 8, wherein the audio jack comprises a socket having a first side and a second side, and wherein the end terminal is positioned on the first side and the detection terminal is positioned on the second side opposite the end terminal.

11. The electronic device of claim 10, wherein the end terminal and the detection terminal are at or near a tip-end of the socket.

12. An electronic device for detecting an audio accessory, comprising:
an audio jack comprising:
an end terminal configured to electrically contact and send audio information to a tip connector of an audio plug of the audio accessory when the audio plug of the audio accessory is inserted into the audio jack; and
a detection terminal spaced apart from the end terminal and positioned within the audio jack to electrically contact the tip connector of the audio plug when the audio plug of the audio accessory is inserted into the audio jack; and
a detection circuit comprising:
a tone generator coupled to the end terminal and configured to generate one or more tones, wherein the one or more tones are inaudible to a human and wherein each tone is modulated with an envelope signal; and
a tone detector coupled to the second terminal and configured to:
detect the one or more tones generated by the tone generator when the end terminal and the detection terminal are shorted by insertion of the audio plug of the audio accessory into the audio jack; and
demodulate and low pass filter each of the one or more detected tones.

13. The electronic device of claim 12, wherein the one or more tones are ultrasonic tones.

14. The electronic device of claim 12, wherein the one or more tones are inaudible to a human and wherein each tone is modulated with an envelope signal.

* * * * *